United States Patent
Fang et al.

(10) Patent No.: US 7,564,708 B2
(45) Date of Patent: *Jul. 21, 2009

(54) METHOD OF PROGRAMMING MEMORY DEVICE

(75) Inventors: Tzu-Ning Fang, Palo Alto, CA (US);
Michael VanBuskirk, Saratoga, CA (US); Swaroop Kaza, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 320 days.

This patent is subject to a terminal disclaimer.

(21) Appl. No.: 11/633,845

(22) Filed: Dec. 5, 2006

(65) Prior Publication Data
US 2008/0130357 A1 Jun. 5, 2008

(51) Int. Cl.
*G11C 11/00* (2006.01)
(52) U.S. Cl. .................... 365/148; 365/151
(58) Field of Classification Search ............... 365/100, 365/148, 151
See application file for complete search history.

(56) References Cited

U.S. PATENT DOCUMENTS

| 7,035,141 | B1* | 4/2006 | Tripsas et al. | 365/175 |
| 7,269,050 | B2* | 9/2007 | Kaza et al. | 365/145 |
| 7,286,388 | B1* | 10/2007 | Chen et al. | 365/151 |
| 7,289,351 | B1* | 10/2007 | Chen et al. | 365/148 |
| 7,355,886 | B1* | 4/2008 | Cai et al. | 365/158 |
| 7,379,317 | B2* | 5/2008 | Bill et al. | 365/72 |
| 2008/0130381 | A1* | 6/2008 | VanBuskirk et al. | 365/189.16 |
| 2008/0130392 | A1* | 6/2008 | Chen et al. | 365/218 |

* cited by examiner

*Primary Examiner*—Tuan T Nguyen
*Assistant Examiner*—Hien N Nguyen

(57) ABSTRACT

In a memory device having first and second electrodes and active and passive layers between the electrodes, or a memory device having first and second electrodes and an insulating layer between and in contact with electrodes, the device may be programmed in the ionic mode by applying electrical potential across the electrodes in one direction, and may be programmed in the electronic charge carrier mode by applying electrical potential across electrodes in the opposite direction.

12 Claims, 6 Drawing Sheets

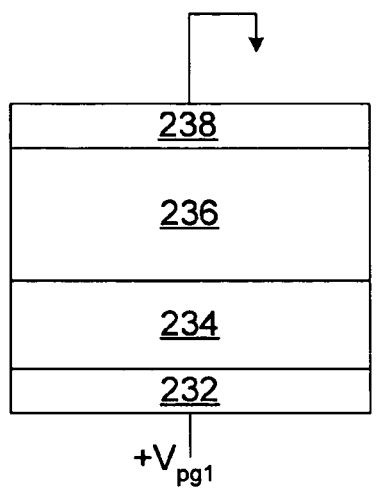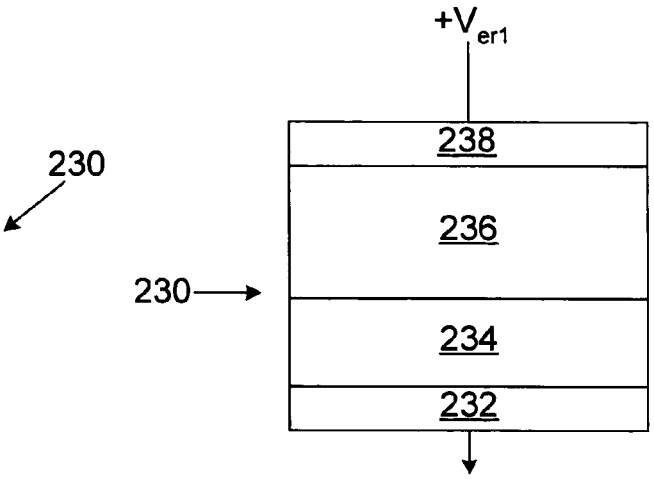
FIGURE 5  FIGURE 6
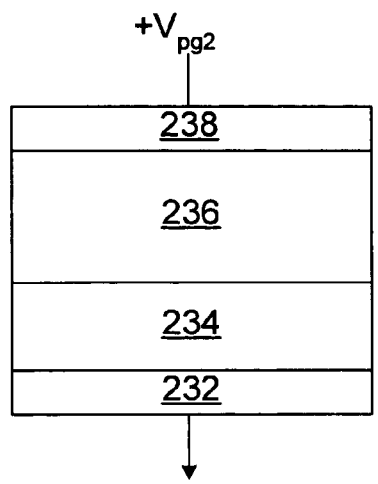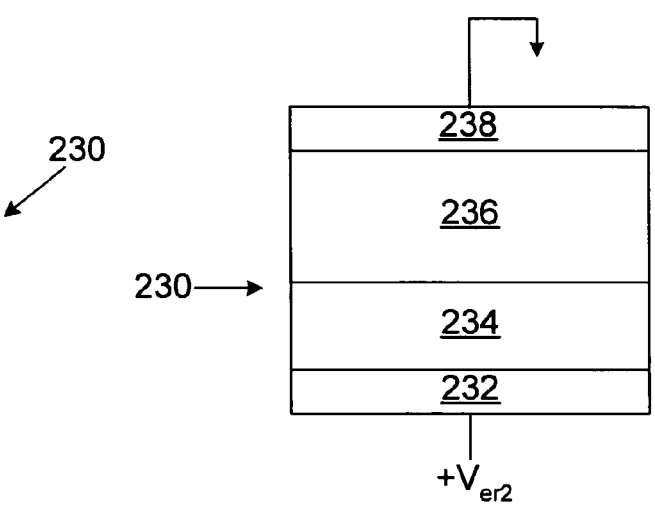
FIGURE 7  FIGURE 8

METHOD OF PROGRAMMING MEMORY DEVICE

BACKGROUND OF THE INVENTION

1. Technical Field

This invention relates generally to memory devices, and more particularly, to methods of programming resistive devices

2. Background Art

The volume, use and complexity of computers and electronic devices are continually increasing. Computers consistently become more powerful, new and improved electronic devices are continually developed (e.g., digital audio players, video players). Additionally, the growth and use of digital media (e.g., digital audio, video, images, and the like) have further pushed development of these devices. Such growth and development has vastly increased the amount of information desired/required to be stored and maintained for computer and electronic devices.

Generally, information is stored and maintained in one or more of a number of types of storage devices. Storage devices include long term storage mediums such as, for example, hard disk drives, compact disk drives and corresponding media, digital video disk (DVD) drives, and the like. The long term storage mediums typically store larger amounts of information at a lower cost, but are slower than other types of storage devices. Storage devices also include memory devices, which are often, but not always, short term storage mediums. Memory devices tend to be substantially faster than long term storage mediums. Such memory devices include, for example, dynamic random access memory (DRAM), static random access memory (SRAM), double data rate memory (DDR), flash memory, read only memory (ROM), and the like. Memory devices are subdivided into volatile and non-volatile types. Volatile memory devices generally lose their information if they lose power and typically require periodic refresh cycles to maintain their information. Volatile memory devices include, for example, random access memory (RAM), DRAM, SRAM and the like. Non-volatile memory devices maintain their information whether or not power is maintained to the devices. Non-volatile memory devices include, but are not limited to, ROM, programmable read only memory (PROM), erasable programmable read only memory (EPROM), flash memory and the like. Volatile memory devices generally provide faster operation at a lower cost as compared to non-volatile memory devices.

Memory devices generally include arrays of memory devices. Each memory device can be accessed or "read", "written", and "erased" with information. The memory devices maintain information in an "off" or an "on" state, also referred to as "0" and "1". Typically, a memory device is addressed to retrieve a specified number of byte(s) (e.g., 8 memory devices per byte). For volatile memory devices, the memory devices must be periodically "refreshed" in order to maintain their state. Such memory devices are usually fabricated from semiconductor devices that perform these various functions and are capable of switching and maintaining the two states. The devices are often fabricated with inorganic solid state technology, such as, crystalline silicon devices. A common semiconductor device employed in memory devices is the metal oxide semiconductor field effect transistor (MOSFET).

The use of portable computer and electronic devices has greatly increased demand for non-volatile memory devices. Digital cameras, digital audio players, personal digital assistants, and the like generally seek to employ large capacity non-volatile memory devices (e.g., flash memory, smart media, compact flash, and the like).

Because of the increasing demand for information storage, memory device developers and manufacturers are constantly attempting to increase storage capacity for memory devices (e.g., increase storage per die or chip). A postage-stamp-sized piece of silicon may contain tens of millions of transistors, each transistor as small as a few hundred nanometers. However, silicon-based devices are approaching their fundamental physical size limits. Inorganic solid state devices are generally encumbered with a complex architecture which leads to high cost and a loss of data storage density. The volatile semiconductor memories based on inorganic semiconductor material must constantly be supplied with electric current with a resulting heating and high electric power consumption in order to maintain stored information. Non-volatile semiconductor devices have a reduced data rate and relatively high power consumption and large degree of complexity. Typically, fabrication processes for such cells are also not reliable.

Therefore, there is a need to overcome the aforementioned deficiencies.

FIG. 1 illustrates a type of memory device 30, which includes advantageous characteristics for meeting these needs. The memory device 30 includes an electrode 32 (for example copper), a copper sulfide layer 34 on the electrode 32, an active layer 36 (for example copper oxide), on the layer 34, and an electrode 38 (for example nickel) on the active layer 36. Initially, assuming that the memory device 30 is unprogrammed, in order to program the memory device 30, ground is applied to the electrode 38, while a positive voltage is applied to electrode 32, so that an electrical potential $V_{pg}$ is applied across the memory device 30 from a higher to a lower electrical potential in the direction from electrode 32 to electrode 38 of the memory device 30 (see FIG. 2, a plot of memory device current vs. electrical potential applied across the memory device 30). This potential is sufficient to cause copper ions to be attracted from the layer 34 toward the electrode 38 and into the active layer 36 (A) so that conductive filaments are formed, causing the active layer 36 (and the overall memory device 30) to be in a low-resistance or conductive state. Upon removal of such potential (B), the ions drawn into the active layer 36 during the programming step remain therein, so that the active layer 36 (and memory device 30) remain in a conductive or low-resistance state.

In the read step of the memory device 30 in its programmed (conductive) state, an electrical potential V, is applied across the memory device 30 from a higher to a lower electrical potential in the direction from electrode to electrode of the memory device 30. This electrical potential is less than the electrical potential $V_{pg}$ applied across the memory device 30 for programming (see above). In this situation, the memory device 30 will readily conduct current, which indicates that the memory device 30 is in its programmed state.

In order to erase the memory device, a positive voltage is applied to the electrode 38, while the electrode 32 is held at ground, so that an electrical potential $V_{er}$ (the "erase" electrical potential) is applied across the memory device 30 from a higher to a lower electrical potential in the reverse direction of the memory device 30, i.e., in the direction from electrode to electrode. This potential is sufficient to cause copper ions to be repelled from the active layer 36 toward the electrode 32 and into the layer 34(C), causing the active layer 36 (and the overall memory device 30) to be in a high-resistance or substantially non-conductive state. This state remains upon removal of such potential from the memory device 30.

In the read step of the memory device 30 in its erased (substantially non-conductive) state, the electrical potential $V_r$ is again applied across the memory device 30 from a higher to a lower electrical potential in the direction from electrode to electrode of the memory device 30, as described above. With the active layer 34 (and memory device 30) in a high-resistance or substantially non-conductive state, the memory device 30 will not conduct significant current, which indicates that the memory device 30 is in its erased state.

FIG. 3 illustrates another type of memory device 130, which also includes advantageous characteristics for meeting the needs set forth above. The memory device 130 includes an electrode 132 (for example copper), an insulating layer 134 (for example copper oxide) on the electrode 132, and an electrode 136 (for example titanium/titanium nitride) on the insulating layer 134. Initially, assuming that the memory device 130 is unprogrammed, in order to program the memory device 130, ground is applied to the electrode 132, while a positive voltage is applied to electrode 136, so that an electrical potential $V_{pg}$ is applied across the memory device 130 from a higher to a lower electrical potential in the direction from electrode 136 to electrode 132. This causes electronic charge carriers in the form of electrons and/or holes to enter the insulating layer 134 and to fill traps contained in layer 134, to provide that the overall memory device 130 is in a conductive, low-resistance (programmed) state (A, FIG. 4). Upon removal of such potential the memory device 130 remains in a conductive or low-resistance state having an on-state resistance illustrated at B.

In the read step of the memory device 30 in its programmed (conductive) state, an electrical potential $V_r$ is applied across the memory device 130 from a higher to a lower electrical potential in the direction from electrode 136 to electrode 132. This electrical potential is less than the electrical potential $V_{pg}$ applied across the memory device 130 for programming (see above). In this situation, the memory device 130 will readily conduct current, which indicates that the memory device 130 is in its programmed state.

In order to erase the memory device 130, a positive voltage is applied to the electrode 132, while the electrode 136 is held at ground, so that an electrical potential $V_{er}$ is applied across the memory device 130 from a higher to a lower electrical potential in the direction of from electrode 132 to electrode 136. Application of this electrical potential causes electronic charge carriers to leave the traps in the active layer 134(C), so that the overall memory device 130 is in a high-resistance (erased) state.

In the read step of the memory device 130 in its erased (substantially non-conductive) state, the electrical potential $V_r$ is again applied across the memory device 130 from a higher to a lower electrical potential in the direction from electrode 136 to electrode 132 as described above. With the active layer 134 (and memory device 130) in a high-resistance or substantially non-conductive state, the memory device 130 will not conduct significant current, which indicates that the memory device 130 is in its erased state.

Both the embodiment of FIG. 1 and FIG. 3 have exhibited significant advantages. For example, when a memory device is programmed in the ionic mode (FIGS. 1 and 2), and erase speeds are high while voltage requirements for programming and erasing are low. In addition, the device exhibits high operational endurance, i.e. the device may be switched between programmed and erased states many times without diminishing the operational characteristics of the device. On the other hand, when a memory device is programmed in the electronic charge carrier mode (FIGS. 3 and 4), low programming current is required, and the device exhibits long data retention.

What is needed is an approach to programming a memory device which provides advantages set forth above as needed in a particular environment.

DISCLOSURE OF THE INVENTION

In method of programming a memory device from a relatively higher resistance to a relatively lower resistance state, the memory device comprising first and second electrodes and active and passive layers between the first and second electrodes, the method comprises providing an electrical potential across the first and second electrodes to provide that charge carriers are moved from one of the electrodes into the active layer.

In another method of programming a memory device from a relatively higher resistance to a relatively lower resistance state, the memory device comprising first and second electrodes and an insulating layer between and in contact with the first and second electrodes, the method comprises providing an electrical potential across the first and second electrodes to provide that ions are moved from one of the electrodes into the insulating layer.

The present invention is better understood upon consideration of the detailed description below, in conjunction with the accompanying drawings. As will become readily apparent to those skilled in the art from the following description, there are shown and described embodiments of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of illustrative embodiments when read in conjunction with the accompanying drawings, wherein:

FIG. 5 is a cross sectional view of the memory device of the type shown in FIG. 1, showing programming of the device in the ionic mode;

FIG. 6 is a view similar to that of FIG. 5 showing erasing of the device in the ionic mode;

FIG. 7 is a view similar to that of FIG. 5 showing programming of the device in the electronic charge carrier mode;

FIG. 8 is a view similar to that of FIG. 5 showing erasing of the device in the electronic charge carrier mode;

BEST MODE(S) FOR CARRYING OUT THE INVENTION

Reference is now made in detail to specific embodiments of the present invention which illustrate the best mode presently contemplated by the inventors for practicing the invention.

Figure 1:
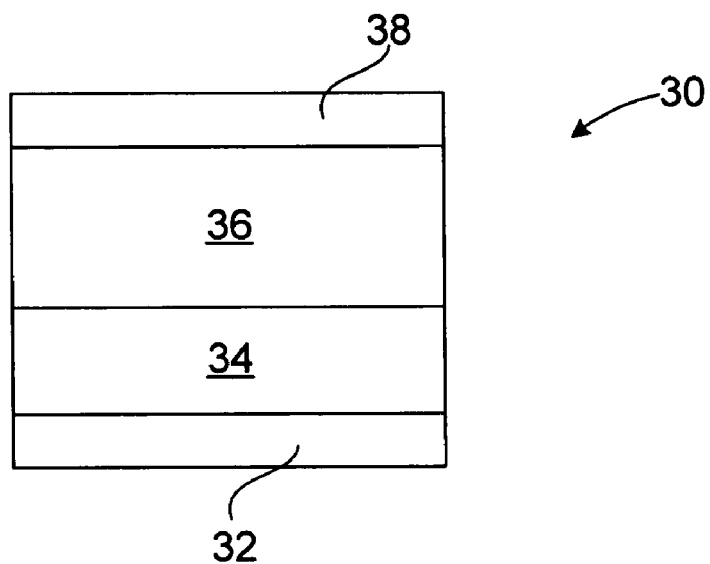
FIG. 1 is a cross-sectional view of an above-described memory device.

FIG. 5 illustrates a memory device 230 similar to that shown in FIG. 1, including a copper (Cu) electrode 232, a copper sulfide ($Cu_2S$) passive layer 234 on and in contact with the electrode 232, a copper oxide ($CuO_z$) active layer 236 on and in contact with the passive layer 234, and a nickel (Ni) electrode 238 on the active layer 236. In a first mode of programming the device 230, i.e., causing the device 230 to go from an erased (relatively high resistance) state to a programmed (relatively low resistance) state, a positive programming voltage $V_{pg1}$ is applied to the electrode 232 while the electrode 238 is held at ground, so that an electrical potential $V_{pg1}$ is applied across the memory device 230 from a higher to a lower electrical potential in the direction from electrode 232 to electrode 238. This potential is sufficient to cause copper ions to be attracted from the layer 234 toward the electrode 238 and into the active layer 236 so that conductive filaments are formed, causing the active layer 236 (and the overall memory device 230) to be in a low-resistance or conductive state.

In order to erase the memory device 230 programmed as in FIG. 5 (FIG. 6), a positive voltage $V_{er1}$ is applied to the electrode 238, while the electrode 232 is held at ground, so that an electrical potential $V_{er1}$ is applied across the memory device 230 from a higher to a lower electrical potential in the direction from electrode 238 to electrode 232. This potential is sufficient to cause copper ions to be repelled from the active layer 236 toward the electrode 232 and into the layer 234, causing the active layer 236 (and the overall memory device 230) to be in a high-resistance or substantially non-conductive state.

Figure 2:
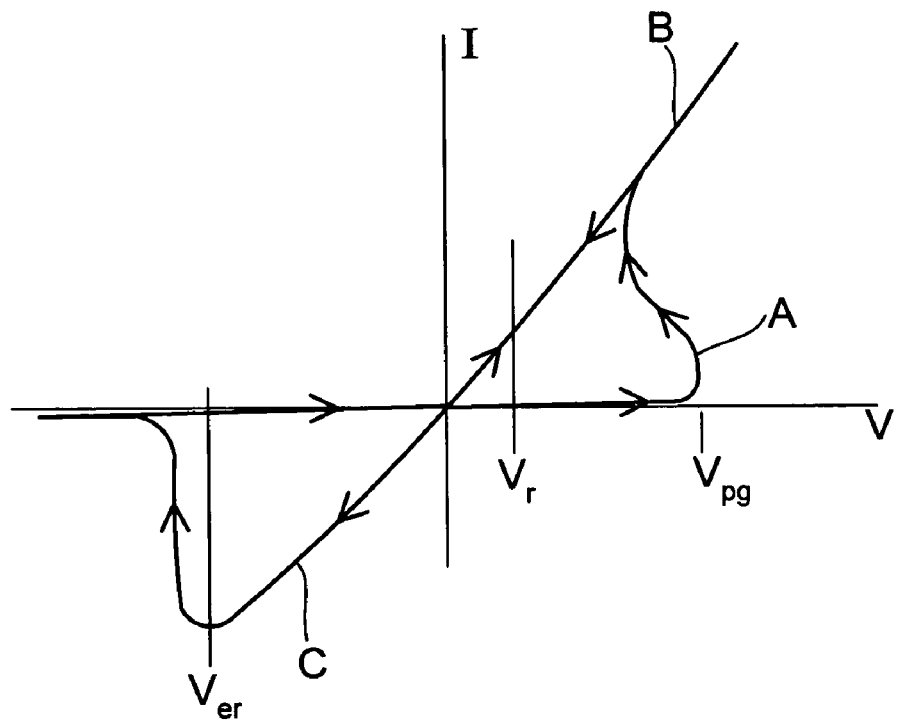
FIG. 2 is a plot of current vs. voltage illustrating operating characteristics of the memory device of FIG. 1.

These programming and erase methods of FIGS. 5 and 6 are similar to those disclosed above with regard to FIGS. 1 and 2.

As a programming alternative, and with reference to FIG. 7, with the memory device 230 in its erased state, a positive programming voltage $V_{pg2}$ is applied to the electrode 238 while the electrode 232 is held at ground, so that an electrical potential $V_{pg2}$ is applied across the memory device 230 from a higher to a lower electrical potential in the direction from electrode 238 to electrode 232, i.e., the reverse or opposite direction as compared to the prior programming method of the device 230, FIG. 5. This potential is sufficient to cause electronic charge carriers in the form of electrons and/or holes to be attracted from the electrode 232 and/or the electrode 238 into the active layer 236 and to fill traps therein, causing the active layer 236 (and the overall memory device 230) to be in a low-resistance or conductive state.

In order to erase the memory device programmed as in FIG. 7 (FIG. 8), a positive voltage $V_{er2}$ is applied to the electrode 232, while the electrode 238 is held at ground, so that an electrical potential $V_{er1}$ is applied across the memory device 230 from a higher to a lower electrical potential in the direction from electrode 232 to electrode 238. This potential is sufficient to cause electronic charge carriers to leave the traps in the active layer 236, causing the active layer 236 (and the overall memory device 230) to be in a high-resistance or substantially non-conductive state.

Figure 3:
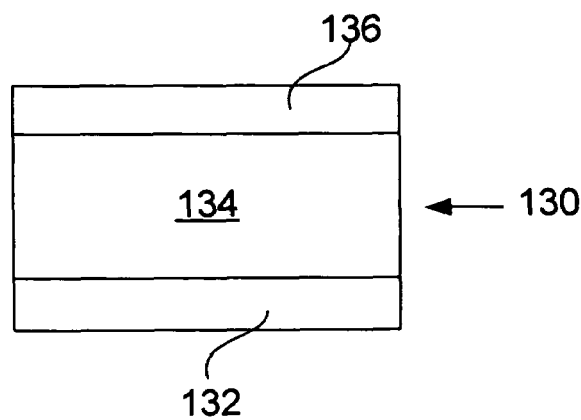
FIG. 3 is a cross-sectional view of another above-described memory device.
Figure 4:
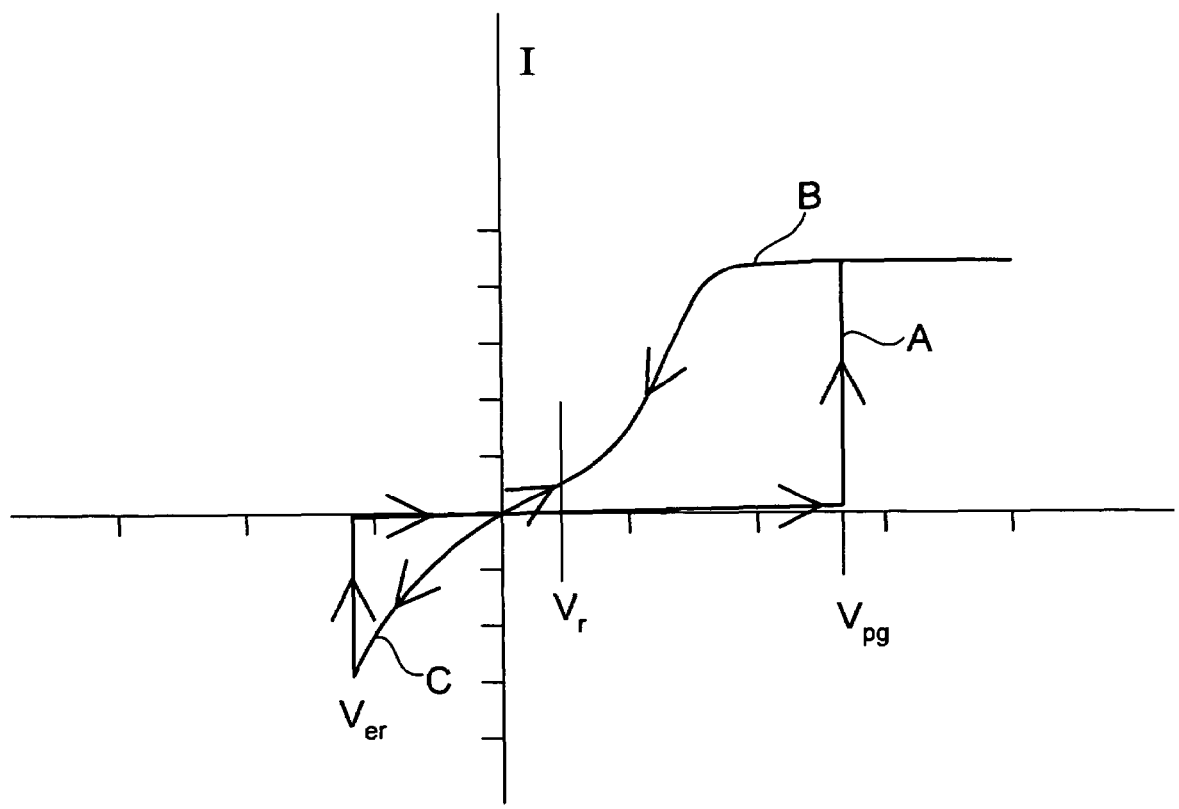
FIG. 4 is a plot of current vs. voltage illustrating operating characteristics of the memory device of FIG. 3.
Figure 9:
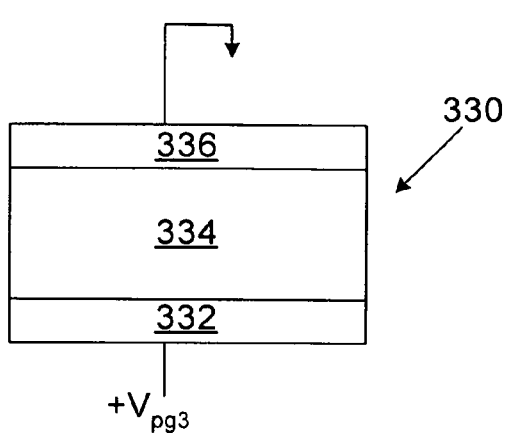
FIG. 9 is a cross sectional view of the memory device of the type shown in FIG. 3, showing programming of the device in the ionic mode.

FIG. 9 illustrates a memory device 330 similar to that shown in FIG. 3, including a copper (Cu) electrode 332, a copper oxide ($CuO_x$) insulating layer 334 on and in contact with the electrode 332, and a titanium/titanium nitride (Ti/TiN), nickel (Ni), or cobalt (Co) electrode 336 on and in contact with the insulating layer 334. In a first mode of programming the device 330, i.e., causing the device 330 to go from an erased (relatively high resistance) state to a programmed (relatively low resistance) state, a positive programming voltage $V_{pg3}$ is applied to the electrode 332 while the electrode 336 is held at ground, so that an electrical potential $V_{pg3}$ is applied across the memory device 330 from a higher to a lower electrical potential in the direction from electrode 332 to electrode 336. This potential is sufficient to cause copper ions to be attracted from the electrode 332 toward the electrode 336 and into the insulating layer 334 so that conductive filaments are formed, causing the insulating layer 334 (and the overall memory device 330) to be in a low-resistance or conductive state.

Figure 10:
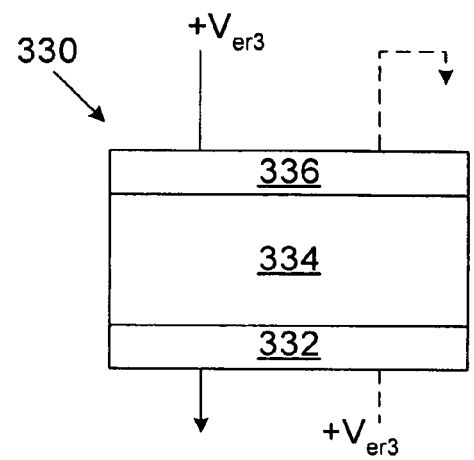
FIG. 10 is a view similar to that of FIG. 9 showing erasing of the device in the ionic mode.

In order to erase the memory device 330 programmed as in FIG. 9 (FIG. 10), a positive voltage $V_{er3}$ is applied to the electrode 336, while the electrode 332 is held at ground (shown in solid lines in FIG. 10), so that an electrical potential $V_{er3}$ is applied across the memory device 330 from a higher to a lower electrical potential in the direction from electrode 336 to electrode 332. This potential is sufficient to cause copper ions to be repelled from the insulating layer 334 toward and into the electrode 332, causing the insulating layer 334 (and the overall memory device 330) to be in a high-resistance or substantially non-conductive state. As an alternative, a positive voltage $V_{er3}$ may be applied to the electrode 332, while the electrode 336 is held at ground (shown in dotted lines in FIG. 10), so that an electrical potential $V_{er3}$ is applied across the memory device 330 from a higher to a lower electrical potential in the direction from electrode 332 to electrode 336. This potential is sufficient to cause copper ions to be repelled from the insulating layer 334 toward and into the electrode 336, causing the insulating layer 334 (and the overall memory device 330) to be in a high-resistance or substantially non-conductive state.

Figure 11:
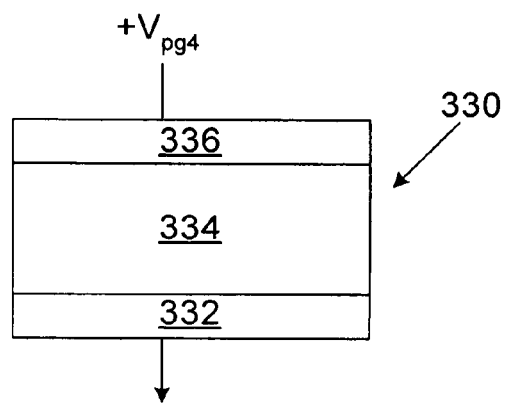
FIG. 11 is a view similar to that of FIG. 9 showing programming of the device in the electronic charge carrier mode.

As a programming alternative, and with reference to FIG. 11, with the memory device 330 in its erased state, a positive programming voltage $V_{pg4}$ is applied to the electrode 336 while the electrode 332 is held at ground, so that an electrical potential $V_{pg4}$ is applied across the memory device 330 from a higher to a lower electrical potential in the direction from electrode 338 to electrode 332, i.e., the reverse or opposite direction as compared to the previous programming method of the device 330, FIG. 9. This potential is sufficient to cause electronic charge carriers in the form of electrons and/or holes to be attracted into the insulating layer 334 and to fill traps therein, causing the insulating layer 334 (and the overall memory device 330) to be in a low-resistance or conductive state.

Figure 12:
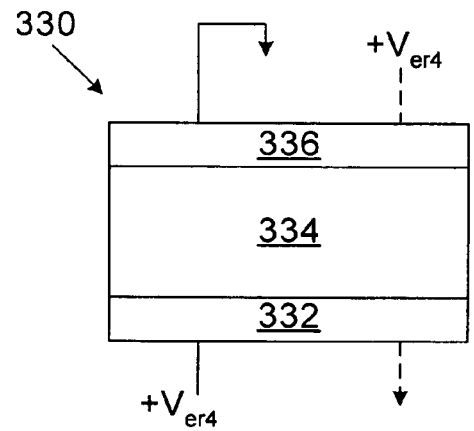
FIG. 12 is a view similar to that of FIG. 9 showing erasing of the device in the electronic charge carrier mode.

In order to erase the memory device 330 programmed as in FIG. 11 (FIG. 12), a positive voltage $V_{er4}$ is applied to the electrode 332, while the electrode 336 is held at ground (shown in solid lines in FIG. 12), so that an electrical potential $V_{er4}$ is applied across the memory device 330 from a higher to a lower electrical potential in the direction from electrode 332 to electrode 336. This potential is sufficient to cause electronic charge carriers to leave the traps in the insulating layer 334, causing the insulating layer 334 (and the overall memory device 330) to be in a high-resistance or substantially non-conductive state. As an alternative, a positive voltage $V_{er4}$ is applied to the electrode 332, while the electrode 336 is held at ground (shown in dotted lines in FIG. 12), so that an electrical potential $V_{er4}$ is applied across the memory device 330 from a higher to a lower electrical potential in the direction from electrode 336 to electrode 332. This potential is sufficient to cause electronic charge carriers to leave the traps in the insulating layer 334, causing the insulating layer 334 (and the overall memory device 330) to be in a high-resistance or substantially non-conductive state.

As will be seen, each embodiment of memory device may be programmed either in the ionic mode or the electronic charge carrier mode, as selected. This enables one to select the operating characteristics of the memory device as described above. For example, a device may be programmed in the ionic mode when it is desired that the device exhibit high programming and erase speeds with low voltage requirements for programming and erasing. In addition, a device programmed and erased in this manner exhibits high operational endurance, i.e. the device may be switched between programmed and erased states many times without diminishing the operational characteristics of the device. These operating characteristics are similar to those in a DRAM type memory. On the other hand, the device may be programmed in the electronic charge carrier mode when it is desired that the device exhibit low programming current requirements and long data retention. These operating characteristics are similar to those in a flash type memory.

Figure 13:
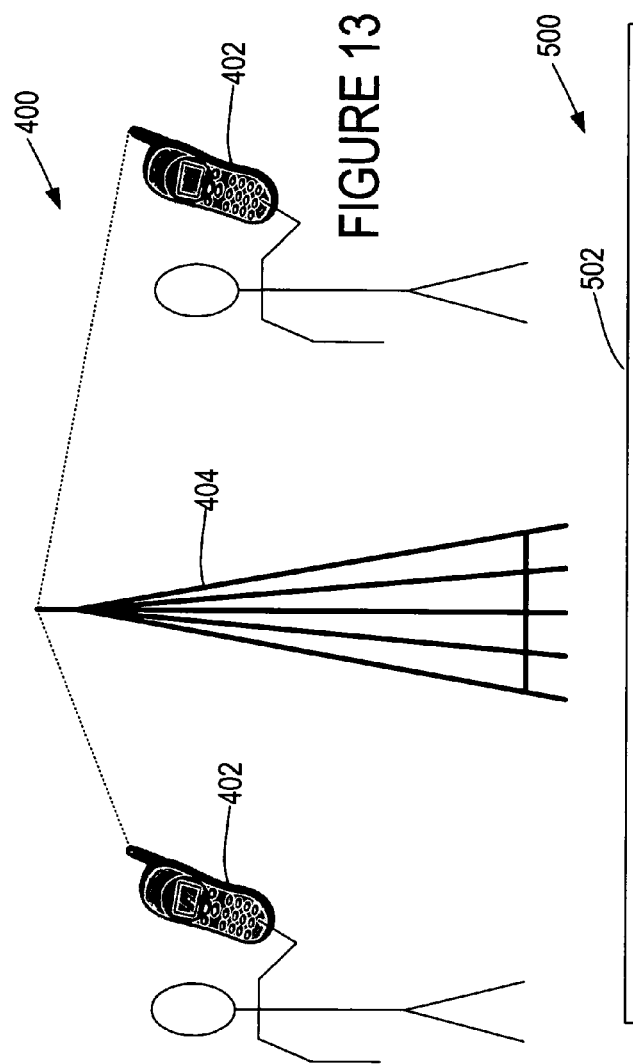
FIGS. 13-15 are systems incorporating memory devices of the present type.

FIG. 13 illustrates a system 400 utilizing memory devices as described above. As shown therein, the system 400 includes hand-held devices in the form of cell phones 402, which communicate through an intermediate apparatus such as a tower 404 (shown) and/or a satellite. Signals are provided from one cell phone to the other through the tower 404. Such a cell phone 402 with advantage uses memory devices of the type described above for data storage, for example names, telephone number and other data. One skilled in the art will readily understand the advantage of using such memory devices in other hand-held devices which utilize data storage, such as portable media players, personal digital assistants, digital cameras and the like.

Figure 14:
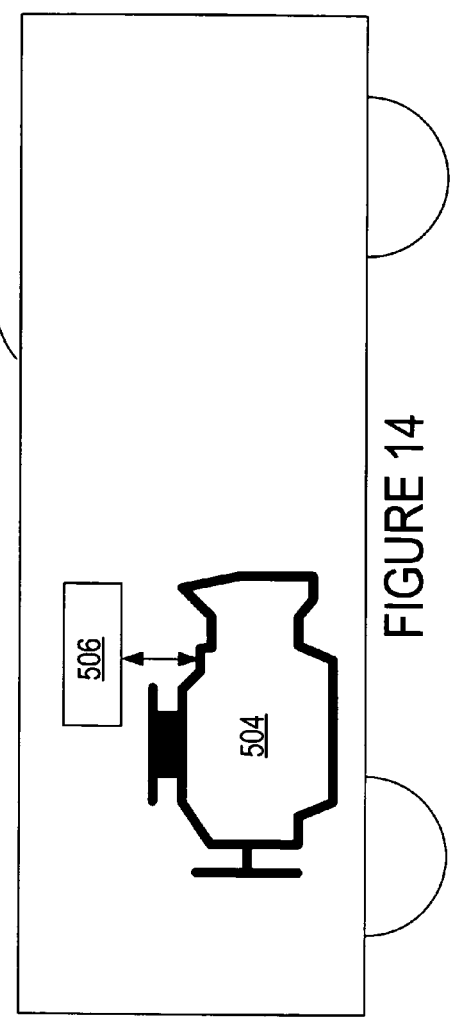

FIG. 14 illustrates another system 500 utilizing memory devices as described above. The system 500 includes a vehicle 502 having an engine 504 controlled by an electronic control unit 506. The electronic control unit 506 with advantage uses memory devices of the type described above for data storage, for example data relating to engine and vehicle operating conditions.

Figure 15:
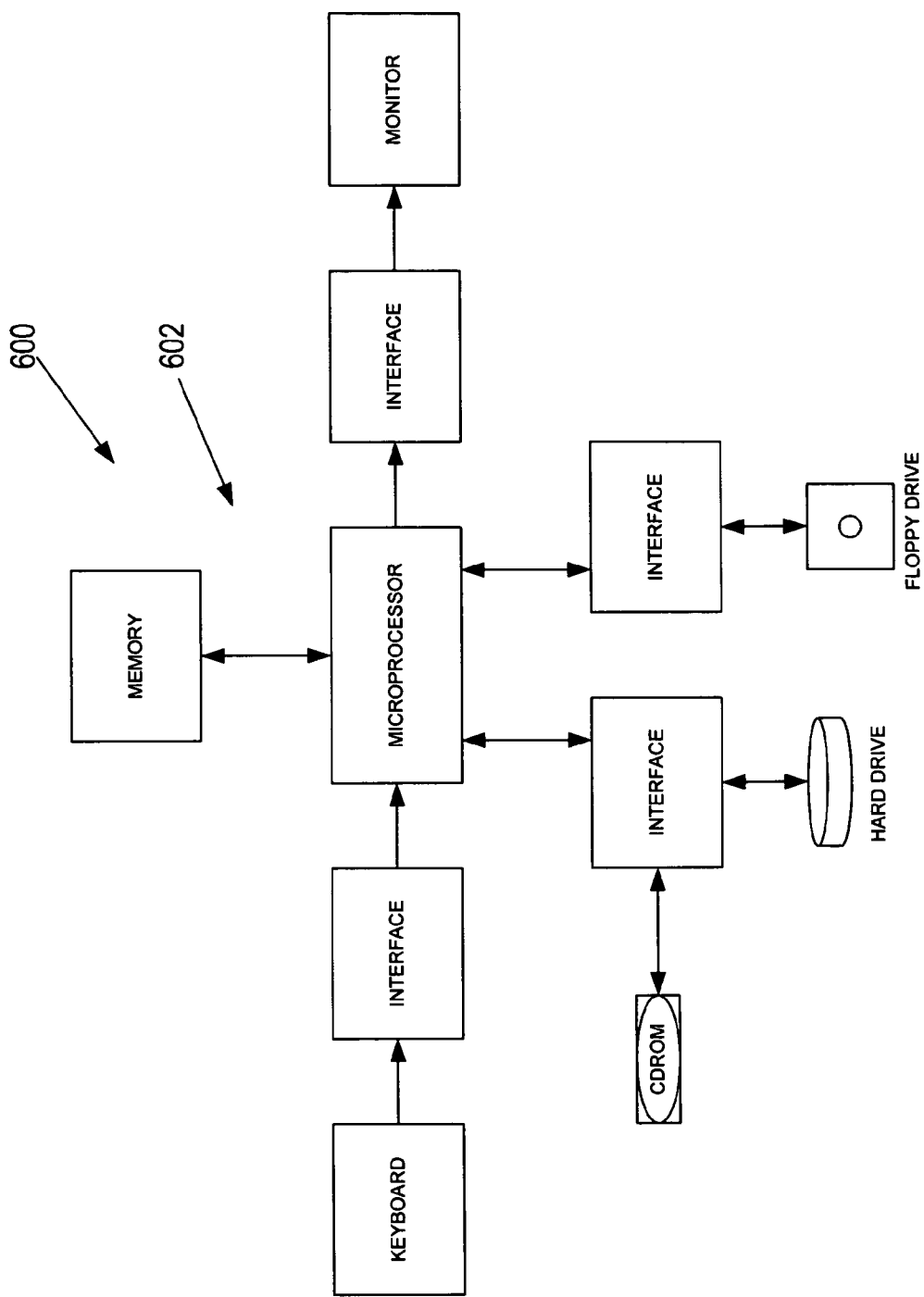

FIG. 15 illustrates yet another system 600 utilizing memory devices as described above. This system 600 is a computer 602 which includes an input in the form of a keyboard, and a microprocessor for receiving signals from the keyboard through an interface. The microprocessor also communicates with a CDROM drive, a hard drive, and a floppy drive through interfaces. Output from the microprocessor is provided to a monitor through an interface. Also connected to and communicating with the microprocessor is memory which may take the form of ROM, RAM, flash and/or other forms of memory. The memory with advantage uses memory devices of the type described above for storage of any data which is of use.

The foregoing description of the embodiments of the invention has been presented for purposes of illustration and description. It is not intended to be exhaustive or to limit the invention to the precise form disclosed. Other modifications or variations are possible in light of the above teachings.

The embodiments were chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of programming a memory device from a relatively higher resistance to a relatively lower resistance state, the memory device comprising first and second electrodes and active and passive layers between the first and second electrodes, the method comprising providing an electrical potential across the first and second electrodes to provide that charge carriers are moved from one of the electrodes into the active layer.

2. The method of claim 1 wherein the charge carriers comprise electrons.

3. The method of claim 1 wherein the charge carriers comprise holes.

4. The method of claim 1 and further comprising an alternate programming method comprising providing an electrical potential across the first and second electrodes to provide that ions are moved from the passive layer into the active layer.

5. The method of claim 4 wherein in the first-mentioned method, an electrical potential is applied across the first and second electrodes from higher to lower potential in a first direction, and wherein in the alternate programming method, an electrical potential is applied across the first and second electrodes from higher to lower potential in a second direction opposite the first direction.

6. A method of programming a memory device from a relatively higher resistance to a relatively lower resistance state, the memory device comprising first and second electrodes and an insulating layer between and in contact with the first and second electrodes, the method comprising providing an electrical potential across the first and second electrodes to provide that ions are moved from one of the electrodes into the insulating layer.

7. The method of claim 6 and further comprising an alternate programming method comprising providing an electrical potential across the first and second electrodes to provide that charge carriers are moved from the electrode into the insulating layer.

8. The method of claim 7 wherein the charge carriers comprise electrons.

9. The method of claim 7 wherein the charge carriers comprise holes.

10. The method of claim 7 wherein in the first-mentioned method, an electrical potential is applied across the first and second electrodes from higher to lower potential in a first direction, and wherein in the alternate programming method, an electrical potential is applied across the first and second electrodes from higher to lower potential in a second direction opposite the first direction.

11. The method of claim 1 and further comprising said memory device incorporated in a system.

12. The method of claim 11 wherein the system is selected from the group consisting of a hand-held device, a vehicle, and a computer.

* * * * *